United States Patent [19]

Hsieh et al.

[11] Patent Number: 5,436,112
[45] Date of Patent: Jul. 25, 1995

[54] METHOD FOR PRODUCING A NEGATIVE IMAGE WITH COLOR PROOFING ELEMENT CONTAINING A URETHANE MONOMER

[75] Inventors: Shane Hsieh, Bridgewater; Wojciech A. Wilczak, Jersey City, both of N.J.

[73] Assignee: Hoechst Celanese Corporation, Somerville, N.J.

[21] Appl. No.: 221,676

[22] Filed: Apr. 1, 1994

[51] Int. Cl.6 ................................ G03C 3/00
[52] U.S. Cl. ..................... 430/253; 430/254; 430/257; 430/260; 430/292; 430/293
[58] Field of Search ............. 430/253, 254, 257, 260, 430/292, 293

[56] References Cited

U.S. PATENT DOCUMENTS

| | | | |
|---|---|---|---|
| 3,856,830 | 12/1974 | Kuehn | 260/404.5 |
| 3,954,714 | 5/1976 | Kuehn | 260/47 |
| 5,300,399 | 4/1994 | Wilczak | 430/257 |

Primary Examiner—Charles L. Bowers, Jr.
Assistant Examiner—Geraldine Letscher
Attorney, Agent, or Firm—Palaiyur S. Kalyanaraman

[57] ABSTRACT

This invention provides novel ethylenically unsaturated urethane monomers and photoreactive compositions comprising such monomers as essential constituents. The monomers can be photopolymerized or photocrosslinked and are useful in coating systems and multilayer color proofing systems. Additionally, they offer superior advantages such as significantly reduced migration between layers in multilayer color proofing systems.

5 Claims, No Drawings

METHOD FOR PRODUCING A NEGATIVE IMAGE WITH COLOR PROOFING ELEMENT CONTAINING A URETHANE MONOMER

FIELD OF THE INVENTION

The subject matter of this invention is related to that disclosed in copending patent application, Ser. No. 08/221,672, filed of even date herewith, now abandoned. The present invention relates to novel ethylenically unsaturated monomers. Such monomers are useful as photoreactive compounds in photopolymerizing and photocrosslinking applications. When used in multilayer color proofing systems, they also offer significantly reduced migration of monomer between layers.

BACKGROUND OF THE INVENTION

Photopolymerizing and photocrosslinking compounds have widespread applications in the industry. For example, processes related to coatings, photoresists, lithographic plates and the like are based on such compounds. Photopolymerization and photocrosslinking have been subject of several review articles such as, for example, in *Encyclopedia of Polymer Science and Engineering*, Volume 4, page 350 (John Wiley & Sons, Inc., New York, 1986) and ibid., Vol. 11, 187 (1988). Generally, photoreactive compositions contain monomers which, under the action of light, polymerize (photopolymerization) or crosslink when additional monomers are present (photocrosslinking). They may also crosslink on their own if they are multifunctional. A photoinitiator (or photosensitizer) is generally used in such reactions, although it is not always necessary.

Photopolymerizable compositions as used at present contain polymerizable monomers such as, for example, esters of acrylic or methacrylic acid, particularly those of acrylic acid with polyhydric aliphatic alcohols. Exemplary thereof are the following monomers; hexanediol(1,6)-diacrylates, triethylene glycol diacrylate, polyethylene glycol diacrylate, neopentyl glycol diacrylate, diglycerol diacrylate, trimethylol propane triacrylate, pentaerythritol tetraacrylate, and dipentaerythritol penta-and hexa-acrylate, There are several deficiencies associated with such monomers in the presently known photoreactive systems. For example, triethylene glycol diacrylate, trimethylol ethane triacrylate and trimethylol propane triacrylate, have undesirably high volatility. Monomers such as pentaerythritol tetraacrylate are solid at room temperature and crystalize in the photopolymer layer, thus affecting film quality. Furthermore, in case of monomers such as, for example, pentaerythritol triacrylate and dipentaerythritol penta- and hexaacrylates, unwanted monomer migration typically occurs in photopolymerizable systems, again affecting the usefulness of such systems.

Thus, there is a need in the industry for monomers that have high photoreactivity, sufficiently low vapor pressures, a viscous fluid character, as well as low susceptibility for monomer migration.

European Patent Application number 91300706.8 (Minnesota Mining and Manufacturing Company) discloses polymeric compositions containing halomethyl-1,3,5-triazine moieties for photosensitive applications, to tackle migration problems. It would, however, be useful if monomer systems which have the desired properties are available since the additional polymerization step can be avoided.

It is therefore an object of the present invention to provide new photopolymerizable monomers which are highly photoreactive and can be used as an integrated component in photopolymerizable and photocrosslinkable coating systems.

It is a further object of the present invention to provide improved photocrosslinkable coating systems with minimal migration of monomer to the interfaces.

It is another object of the present invention to provide an improved multilayer color proofing system with the novel monomers of this invention incorporated in such system.

SUMMARY OF THE INVENTION

One or more objects of the invention are achieved by the inventive novel photoreactive composition. The composition contains, as an essential component, at least one polymerizable urethane (carbamate) monomer with chemical structure shown in FIG. 1:

$$[CH_3(CH_2)_m] [CH_3(CH_2)_n] G [(CH_2)_x NHCOOR]_2$$

FIG. 1 where G represents a $C_4$–$C_8$ cycloalkyl ring, m, n and x are aliphatic hydrocarbon chains containing $C_4$–$C_9$ carbon atoms, and R is a partial ester of an acrylic acid or methacrylic acid with a polyhydric alcohol. The inventive monomer composition is used as an essential component in the color layer for forming color proofing articles. Additionally, one or more binder components and one or more photoinitiators may also be present in the color layer composition. A polyhydric alcohol useful in this invention is a compound containing at least two hydroxyl groups on a $C_5$–$C_{15}$ carbon chain. A partial ester is the ester obtained when said polyhydric alcohol is esterified with the acrylic or methacrylic acid such that at least one hydroxyl group in said polyhydric alcohol remains unesterified.

An illustrative monomer corresponding to FIG. 1 and useful in the present invention is the urethane monomer prepared by reacting dipentaerythritol pentaacrylate and 2-heptyl-3,4-bis-(9-isocyanatononyl)-1-pentyl cyclohexane, with the chemical structure shown in FIG. 2:

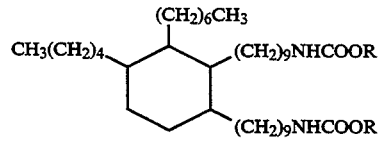

FIG. 2 where R is dipentaerythritol pentaacryloyl moiety.

DETAILED DESCRIPTION OF THE INVENTION

In one embodiment, the present invention discloses photosensitive compositions useful in coating systems, photoresists, dry film photoresists, multilayer color proofing systems, printing plates and similar applications. Such compositions contain, as an essential component, at least one photoreactive urethane monomer corresponding to the chemical structure in FIG. 1. The inventive monomers of FIG. 1 may be photopolymerized, or photocrosslinked. Photocrosslinking may additionally be done in the presence of, for example, other monomers or binder resins. A photoinitiator is typically used in the photoreactive compositions. Monomers of FIG. 1 are highly viscous, of low volatility and are substantially colorless products, making them ideally suitable for the above-stated applications.

The monomers of this embodiment are urethane compositions which may be prepared by known methods. Urethanes are generally prepared by reacting a suitable isocyanate material with a suitable alcohol. In the preparation of the monomers encompassed by FIG. 1, partial esters of the acrylic acid or methacrylic acid with polyhydric alcohols are used as the alcohol component, which is then reacted with a suitable isocyanate. The reaction is done in such a manner that all the isocyanate is converted into urethane, which now contains the acrylate or methacrylate groups as the photoreactive moieties.

A typical preparation of the inventive monomers may be illustrated by the synthesis of the compound of FIG. 2, from dipentaerythritol pentaacrylate (commercially available from Polysciences, Inc., Warrington, Pa.), and 2-heptyl-3,4-bis-(9-isocyanatononyl)-1-pentyl cyclohexane (DDI 1410 TM, supplied by Henkel Corporation, LaGrange, Ill.).

Dipentaerythritol pentaacrylate and DDI 1410 TM are charged into a suitable reactor along with a suitable solvent and a suitable catalyst for forming an urethane adduct. Generally an inert atmosphere such as, for example, $N_2$, argon and the like, are employed during the reaction. Suitable solvents are non-hydroxylic hydrocarbons, ketones, esters and the like, and suitable catalysts, for example, dibutyltin dilaurate. The reaction mixture is stirred at about 20°–100° C. for about 2–24 hours for completion of the reaction. Completion of the reaction may be generally monitored by infrared spectrometry, following the disappearance of the isocyanate absorption band at about 2270 cm$^{-1}$. Removal of the solvent yields the desired urethane monomer with the formula in FIG. 2.

Another embodiment of the present invention includes films prepared with the inventive monomers described above. The monomers may be dissolved in a suitable solvent such as, for example, hydrocarbons, ketones, esters, amides and mixtures thereof, the solution filtered if necessary and then coated on a suitable substrate by conventional processes to deposit a film on the substrate. Suitable coating techniques include spray coating, spin coating, roller coating, dip coating and the like. The concentration of the solution and the coating speeds may be suitably adjusted to get films of desired thickness. Suitable substrate materials include metal, glass, plastic and the like.

A further embodiment of the present invention include polymers formed by photopolymerization of the inventive monomers. In a typical experiment, the monomer and a suitable photoinitiator in concentrations of about 0.5–20 weight % based on the monomer are dissolved in a suitable solvent as described above and the solution coated on a suitable substrate as described above. Suitable photoinitiators (photosensitizers) are described, for example, by B. Gupta and P. Kalyanaraman in U.S. Pat. No. 4,929,537. Other suitable photoinitiators include triazines, as well as the Irgacure TM brand photosensitizers, (available from Ciba-Geigy Corporation, Ardsley, N.Y.), quinoxalines, acridines, imidazoles, thiaxanthones, acetophenones, and the like, and mixtures thereof. The film may then be exposed to light of suitable radiation for a suitable length of time, whereupon the film photopolymerizes.

Yet another embodiment of the present invention include photocrosslinked films prepared from monomers of the present invention. Typically a comonomer or a binder resin is used for crosslinking purposes and a photoinitiator is also used. Suitable comonomers or binder resins include acrylates, methacrylates, other vinyl monomers, styrenes and the like. In an illustrative experiment, the urethane monomer of FIG. 2 and 2-hydroxyethyl methacrylate (from Aldrich Chemical Company, Milwaukee, Wis.) are combined in about 2:1 w/w ratio in a solvent such as methyl ethyl ketone, a photoinitiator such as Irgacure 369 TM (2-benzyl-2-N,N-dimethylamino-1-(4-morpholinophenyl)-1-butanone, U.S. Pat. No. 4,992,547) is added in about 1–20 weight % based on total monomers and the solution is coated on a polyester substrate, such as polyethylene terephthalate. Removal of the solvent followed by exposure to suitable light crosslinks the film. The crosslinked film is resistant to rubbing with methyl ethyl ketone.

In another embodiment, the inventive monomers are suitable for forming photoadhering layers in color proofing articles. When used in such applications, the films formed with the inventive monomers surprisingly demonstrate no or significantly reduced migration of monomers between layers as compared to when conventional monomers are used as such photoadhering layer materials. This surprising advantage of the inventive monomers could be demonstrated as follows. A color proofing article containing the monomer of FIG. 2 in its photoadhering layer was prepared as follows and as more fully explained in the EXAMPLES section. Suitable processes to prepare color proofing articles are also discussed in copending patent application, Ser. No. 08/221,672, filed of even date herewith, now abandoned.

A control color proofing article was prepared as follows for comparative purposes (see EXAMPLE 7). First a suitable color layer solution was prepared and coated on a suitable plastic substrate. The color layer solution comprised one or more suitable pigments, one or more solvents and one or more binder resins. Suitable binder resins may be selected from the group consisting of styrene/maleic anhydride copolymers and their half esters; acrylic polymers and copolymers; polyamides; polyvinyl pyrrolidones; cellulosic resins; phenolic resins; polyvinyl acetals, polyvinyl acetates and their copolymers, and mixtures thereof. The color layer was then overcoated with a photoadhering layer prepared from conventional crosslinking monomers such as, for example, acrylates, methacrylates and the like, such as dipentaerythritol pentaacrylate. The photoadhering layer may additionally contain binders, photoinitiators and the like. The photoadhering layer was then overcoated with a suitable adhesive solution, and then laminated to a receiver sheet. The thus prepared plate was imagewise exposed to suitable actinic radiation. The selected radiation has wavelength range that is suitable to photopolymerize or photocrosslink the materials as is known to those skilled in the art. After irradiation, the cover sheet is peeled away. Negative magenta images were left on the receiver sheet, thus showing significant migration of the monomer and photoinitiator between layers in the multilayer color proofing system.

Next, a color proofing article was prepared by a similar process but with the exception that the inventive monomer of FIG. 2 was used in the photoadhering layer for crosslinking purposes instead of the conventional monomer (dipentaerythritol pentaacrylate in the above-described control) (see EXAMPLE 8). Exposure in a similar manner left no images on the receiver sheet, thus demonstrating no or significantly reduced migration of monomer and photoinitiator between layers in the multilayer color proofing system.

While migration could be significantly reduced by using the inventive monomer in the photoadhering layer, excellent images could be obtained by using the inventive monomer in the color layer, showing its utility in preparing color proofing articles (see EXAMPLE 9). Thus, when the monomer is present in the color layer, and not in the photoadhering layer, the above-described process yielded excellent images.

The following EXAMPLES are provided in order to further illustrate the present invention; however, the invention is in no way limited thereby.

EXAMPLES

Example 1

Preparation of the monomer of FIG. 2 at room temperature

A round bottom reactor equipped with overhead stirrer was charged with dry methyl ethyl ketone (1600 g), dipentaerythritol pentaacrylate (250 g), DDI 1410 TM diisocyanate (150 g) and dibutyltin dilaurate (12 g., from Aldrich Chemical Company) and the mixture stirred at room temperature for about 8 hr. At the end of this reaction time infrared analysis of the reaction mixture showed no isocyanate absorption band at 2270 $cm^{-1}$, indicating completed reaction.

Example 2

Preparation of the monomer of FIG. 2 at elevated temperature

A three necked round bottom reactor equipped with overhead stirrer was charged with dry methyl ethyl ketone (1600 g), dipentaerythritol pentaacrylate (250 g), DDI 1410 TM diisocyanate (150 g), and dibutyltin dilaurate (12 g). A steady stream of nitrogen was bubbled through this mixture while slowly raising the temperature of the mixture to 50° C. After 2 hr at 50° C. infrared analysis of the reaction mixture showed no isocyanate absorption band at 2270 $cm^{-1}$, indicating completed reaction.

Example 3

Preparation of urethane monomer from 2-hydroxyethyl methacrylate and DDI 1410 TM A round bottom reactor equipped with overhead stirrer was charged with dry methyl ethyl ketone (1600 g), 2-hydroxyethyl methacrylate (62 g), DDI 1410 TM diisocyanate (150 g), and dibutyltin dilaurate (12 g), and the mixture was stirred at room temperature for 8 hr. At the end of this reaction time infrared analysis of the reaction mixture showed no isocyanate absorption band at 2270 $cm^{-1}$, indicating completed reaction.

Example 4

Use of Monomer of FIG. 2 as a sole monomer in photopolymerization

A coating solution was prepared using the following components:
Monomer from EXAMPLE 1: 19.6 gm
Irgacure 369 TM : 2.2 gm
Methyl ethyl ketone (MEK): 78.2 gm The solution was coated on a polyester film (Melinex 505, from ICI of America, Inc., Wilmington, Del.) by means of a Meier rod #32 to a coating weight of 5 $gm/m^2$. The film was exposed to a 5 KW metal halide lamp for 6 seconds whereby the film photopolymerized, rendering the coating resistant to 50 MEK double rubs.

Example 5

Photocrosslinking of monomer of FIG. 2 with 2-hydroxyethyl methacrylate in a clear coat A coating solution was prepared using the following components:
Monomer from EXAMPLE 1: 13.8 gm
2-Hydroxyethyl methacrylate: 6.1 gm
Irgacure 369 TM : 2.2 gm
Methyl ethyl ketone: 77.9 gm The solution was coated on a piece of polyester film (Melinex 505) by means of a Meier rod #32 to a coating weight of 5 $gm/m^2$. The coating was then exposed to 5 KW metal halide lamp for 6 seconds, which crosslinked the film and rendered it resistant to 50 MEK double rubs.

Example 6

Photocrosslinking of monomer of FIG. 2 with dipentaerythritol pentaacrylate in a clear coat A coating solution was prepared using the following components:
Monomer from EXAMPLE 1: 13.8 gm
Dipentaerythritol pentaacrylate: 6.1 gm
Irgacure 369 TM : 2.2 gm
Methyl ethyl ketone: 77.9 gm The solution was coated on a piece of polyester film (Melinex 505) by means of a Meier rod #32 to a coating weight of 5 $gm/m^2$ Exposure of the coating to 5 KW metal halide lamp for 6 minutes crosslinked the coating and rendered it resistant to 50 MEK double rubs.

Example 7

Control Example to show migration of monomer and photoinitiator between layers in a multilayer color proofing system The following color layer solution was prepared and coated on a 2 mil Melinex polyester film having a crosslinked phenolic layer on top and dried to get 1 $gm/m^2$ coating weight:
1-Methoxy-2-propanol: 45.2 gm
Methyl ethyl ketone: 26.7 gm
Diacetone alcohol: 13.9 gm
A dispersion of Magenta Formvar (Monsanto Company, St. Louis, Mo.) in γ-butyrolactone: 14.2 gm The color coat was then overcoated with the following photoadhering layer solution and dried to get 5 $gm/m^2$ coating weight:
n-Butyl acetate: 81.5 gm
An urethane adduct prepared from polyvinyl butyral (Monsanto Co., St. Louis, Mo.) and isocyanatoethyl methacrylate (Aldrich Chemical Company) by known methods: 12.8 gm
Dipentaerythritol pentaacrylate (a conventional crosslinking monomer): 4.7 gm
2-Biphenyl-1,6-bis-trichloromethyl-s-triazine (from Hoechst AG, Frankfurt, Germany): 0.9 gm The above photoadhering layer was then overcoated with an adhesive solution of Carboset XL-37 (from B. F. Goodrich, Inc., Cleveland, Ohio) in water (about 15 weight % solution) to get 6 gm/m² coating weight This was then laminated to a Pressmatch commercial receiver sheet and then imagewise exposed to an actinic radiation ($\lambda_{max}$=380 nm) through the transparent cover sheet using a UGRA target for 10 seconds in a Theimer exposure unit (Exposure Systems Corp., Bridgeport, Conn.) with 5 KW lamp. Peeling away the cover sheet resulted in a negative magenta image on the receiver sheet, demonstrating that the monomer and photoinitiator had significantly migrated between layers.

Example 8

No or significantly reduced migration between layers when using the monomer of this invention in the photoadhering layer The following color layer solution was prepared and coated on a 2 mail Melinex film having a crosslinked phenolic layer on top, and dried to get 1 gm/m² coating weight:
1-Methoxy-2-propanol: 45.2 gm
Methyl ethyl ketone: 26.7 gm
Diacetone alcohol: 13.9 gm
A dispersion of Magenta Formvar in γ-butyrolactone: 14.2 gm The color coat was then overcoated with the following photoadhering layer solution and dried to get 5 gm/m² coating weight:
n-Butyl acetate: 62.7 gm
Methyl ethyl ketone: 18.9 gm
Adduct of polyvinyl butyral and isocyanatoethyl methacrylate: 12.8 gm
Monomer from EXAMPLE 1: 4.7 gm
2-Biphenyl- 1,6-bis-trichloromethyl-s-triazine: 0.9 gm The above photoadhering layer was then overcoated with an adhesive solution of Carboset XL-37 to get 6 gm/m² coating weight, then laminated to a Pressmatch commercial receiver sheet and finally imagewise exposed to actinic radiation through the transparent cover sheet using a UGRA target for 10 seconds in a Theimer exposure unit with 5 KW lamp. Peeling away the cover sheet resulted in no negative magenta image on the receiver sheet, demonstrating no or significantly reduced migration of the monomer between layers.

Example 9

Preparation of color proofing article using the monomer of FIG. 2 in the color layer The following color layer solution was prepared and coated on a 2 mil Melinex film having a crosslinked phenolic layer on top, and then dried to get 1 gm/m² coating weight:
1-Methoxy-2-propanol: 45.2 gm
Methyl ethyl ketone: 26.0 gm
Diacetone alcohol: 13.9 gm
Monomer from EXAMPLE 1: 0.7 gm
Magenta Formvar Dispersion as in EXAMPLE 8: 14.2 gm The color coat was then overcoated with the following photoadhering layer solution and dried to get 5 gm/m² coating weight:
n-Butyl acetate: 81.5 gm
Adduct of polyvinyl butyral and isocyanatoethyl methacrylate: 12.8 gm
Dipentaerythritol pentaacrylate: 4.7 gm
2-Biphenyl- 1,6-bis-trichloromethyl-s-triazine: 0.9 gm The thus-prepared photosensitive element was then overcoated with an adhesive solution of Carboset XL-37 in water to get 6 gm/m² coating weight, then laminated to a Pressmatch commercial receiver sheet and finally imagewise exposed to actinic radiation through the transparent cover sheet using a UGRA target for 6 seconds in a Theimer exposure unit with 5 KW metal halide lamp. Peeling away the cover sheet resulted in negative magenta image with high resolution on the receiver sheet, thus demonstrating the utility of the inventive monomers in producing excellent color proofing articles.

What is claimed is:

1. A method for producing a negative image which comprises:
    A) providing a photosensitive element which comprises, in order from top to bottom:
        (i) a strippable, transparent cover sheet;
        (ii) a crosslinked layer, which comprises a polymer having phenolic groups;
        (iii) a color layer, which comprises an organic binder, a colorant, and a polymerizable, photosensitive urethane monomer having at least one ethylenically unsaturated group,
    wherein said binder is present in sufficient amounts to bind the color layer components into a uniform film, and wherein said urethane monomer has the chemical structure:

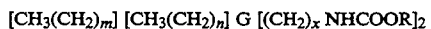

where G represents a $C_4$–$C_7$ cycloalkyl ring, m, n and x are aliphatic hydrocarbon chains containing $C_4$–$C_9$ carbon atoms, R is a partial ester of an acrylic acid or methacrylic acid with a polyhydric alcohol, said polyhydric alcohol comprising at least two hydroxyl groups on a $C_5$–$C_{15}$ carbon chain, and a partial ester is ester obtained when said polyhydric alcohol is esterified with said acrylic or methacrylic acid such that at least one hydroxyl group in said polyhydric alcohol remains unesterified;
        (iv) a photoadhering layer; and
        (v) a thermoplastic adhesive layer;
    (B) laminating said photosensitive element to a receiver sheet;
    (C) imagewise exposing said color layer and said photoadhering layer to actinic radiation through said transparent cover sheet and said crosslinked layer;
    (D) peeling apart said receiver sheet and said transparent cover sheet, leaving exposed areas of the color layer attached to the receiver sheet via the photoadhering layer and adhesive layer, the unexposed areas being removed with the cover sheet and the crosslinked phenolic layer, thereby forming a colored negative image on the receiver sheet; and
    (E) optionally repeating steps (A) through (D) at least once wherein another photosensitive element according to step (A) having at least one different colorant, is transferred via its photoadhering and adhesive layers to the negative image previously produced on the receiver sheet.

2. The method of claim 1 wherein said binder in said color layer comprises one or more resins selected from the group consisting of styrene/maleic anhydride copolymers and their half esters; acrylic polymers and copolymers; polyamides; polyvinyl pyrrolidones; cellulosic resins; phenolic resins; polyvinyl acetals, polyvinyl acetates and their copolymers.

3. The method of claim 1, wherein G is cyclohexyl, m is pentyl, n is heptyl, x is nonyl, and R is an pentaacrylate ester of dipentaerythritol.

4. The method of claim 1, wherein said color layer further comprises a vinyl monomer.

5. A color proofing article which comprises, in order from top to bottom:
 (i) a strippable, transparent cover sheet;
 (ii) a crosslinked layer, which comprises a polymer having phenolic groups;
 (iii) a color layer, which comprises an organic binder, a colorant, and a polymerizable, photosensitive urethane monomer having at least one ethylenically unsaturated group, wherein said binder is present in sufficient amounts to bind the color layer components into a uniform film and wherein said urethane monomer has the chemical structure:

$$[CH_3(CH_2)_m] [CH_3(CH_2)_n] G [(CH_2)_x NHCOOR]_2$$

where G represents a $C_4$–$C_7$ cycloalkyl ring, m, n and x are aliphatic hydrocarbon chains containing $C_4$–$C_9$ carbon atoms, R is a partial ester of an acrylic acid or methacrylic acid with a polyhydric alcohol, said polyhydric alcohol comprising at least two hydroxyl groups on a $C_5$–$C_{15}$ carbon chain, and a partial ester is ester obtained when said polyhydric alcohol is esterified with said acrylic or methacrylic acid such that at least one hydroxyl group in said polyhydric alcohol remains unesterified;
 (iv) a suitable photoadhering layer;
 (v) a thermoplastic adhesive layer; and
 (vi) a receiver sheet.

* * * * *